US007114956B2

(12) United States Patent
Kreitzer et al.

(10) Patent No.: US 7,114,956 B2
(45) Date of Patent: Oct. 3, 2006

(54) ISOLATED BNC CONNECTOR WITH REPLACEABLE BAYONET SHELL

(75) Inventors: Robert R. Kreitzer, Tigard, OR (US); James H. Mc Grath, Jr., Aloha, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 11/015,961

(22) Filed: Dec. 16, 2004

(65) Prior Publication Data

US 2006/0134938 A1 Jun. 22, 2006

(51) Int. Cl.
*H01R 12/00* (2006.01)
*H05K 1/00* (2006.01)

(52) U.S. Cl. ........................................ 439/63; 439/551

(58) Field of Classification Search .................. 439/63, 439/551, 540.1
See application file for complete search history.

(56) References Cited

U.S. PATENT DOCUMENTS 3,437,982 A * 4/1969 O'Keefe et al. ............ 439/578
4,273,407 A * 6/1981 Snuffer et al. .............. 439/579
4,541,683 A * 9/1985 Van Domelen ............. 439/551
4,684,200 A * 8/1987 Capp .......................... 439/387
4,982,055 A * 1/1991 Pollack et al. .............. 174/151
5,722,837 A * 3/1998 Kurahashi .................... 439/63
5,879,166 A * 3/1999 Wang .......................... 439/63
6,386,888 B1 * 5/2002 Skopic et al. ................. 439/63
6,790,080 B1 * 9/2004 Cannon ...................... 439/551
6,942,491 B1 * 9/2005 Khemakhem ................ 439/63
2003/0139092 A1 * 7/2003 Wu ............................ 439/551

OTHER PUBLICATIONS

AMPHENOL® RF, BNC Connector Series, www.amphenolrf.com/products/bnc.asp, 2003-2005, 5 pages.

* cited by examiner

*Primary Examiner*—Hae Moon Hyeon
(74) *Attorney, Agent, or Firm*—Thomas F. Lenihan

(57) ABSTRACT

An insulated Bayonet Neill Concelman (BNC) connector includes a replaceable non-metallic insulating shell. The non-metallic shell is attached to a metallic portion of the BNC connector such that, when mounted on an oscilloscope, or other electronic instrument, the non-metallic shell may be disconnected from the metallic portion of the BNC connector without having to gain access to the interior of the instrument housing. Thus, in the event of damage to the non-metallic shell, the damaged non-metallic shell may be quickly and easily replaced by a user, instead of having to return the instrument to the manufacturer for repair.

10 Claims, 5 Drawing Sheets

ISOLATED BNC CONNECTOR WITH REPLACEABLE BAYONET SHELL

FIELD OF THE INVENTION

The subject invention generally relates to the field of coaxial electrical connectors, and specifically relates to isolated coaxial connectors.

BACKGROUND OF THE INVENTION

Bayonet Neill Concelman (BNC) coaxial connectors are commonly-used in the electronics industry for coupling low voltage signals to a measurement instrument, such as an oscilloscope. The mating halves of BNC connectors are referred to as male and female, respectively. Typically, the male portion of the BNC connector is mounted to the instrument chassis, and the female portion is attached to the end of a coaxial cable, such as a probe cable. The cable-mounted female potion of the BNC connector is secured to the panel-mounted male portion by way of a pair of metal "bayonets" mounted on the male portion of the BNC connector perpendicularly to the major axis of the connector.

In ground-referenced oscilloscopes, the outer shell of the Panel-mounted BNC connector is physically and electrically connected to the chassis of the oscilloscope. The oscilloscope chassis, in turn, is coupled to earth ground through the ground wire of its power cord. So long as no effort is made to interfere with this grounding system, it is safe for an operator of the oscilloscope to touch the outer shell of the BNC connector.

When a probe is connected to the grounded BNC connector on the oscilloscope, the metallic shield of the probe's cable is coupled to ground potential. The ground clip of the probe is also connected to the coaxial shield. Thus, all measurements being taken will be referenced to ground potential. However, there are times when it is necessary for an engineer to make a measurement that is not ground-referenced. In such circumstances, some engineers have resorted to a not-recommended and potentially dangerous practice known as "floating the scope". The term "floating the scope" refers to the above-mentioned practice of interfering with the grounding system of the oscilloscope by breaking the connection between the oscilloscope and earth ground. In such a case, the oscilloscope chassis and the shell of the BNC connector may develop a high and potentially lethal voltage on exposed surfaces.

Fortunately, there is a better solution to the problem of making non-ground-referenced measurements than "floating the scope". The THS700-series portable oscilloscopes manufactured by Tektronix, Inc., Beaverton, Oreg., employ a non-conductive case and a BNC connector having a non-conductive outer surface to prevent inadvertent contact of the user with dangerous voltages that may otherwise be present.

However, there is a problem that arises when such a solution is used. Safety requirements for an isolated instrument require the use of non-metallic BNC shells. The non-metallic shells necessarily require a pair of non-metallic bayonets. These have a history of failing because the bayonets are prone to being sheared from the shell. That is, the forces applied to the BNC connector when mating it will eventually cause the insulating material of the bayonets to fail. When this happens, the oscilloscope must be returned for service. In fact, the rate of replacement of damaged non-metallic BNC connectors can run as high as 300 BNC's per year for this exact problem. Without the bayonets, the mating connector will not be securely coupled to the Panel-mounted portion, and will simply fall off under normal use conditions.

One might think that a solution to the problem would be to change the size or shape of the bayonets to increase their strength. Unfortunately, geometry changes to increase strength are not permitted because the instrument must remain compatible with all existing BNC receptacles owned by the customer.

SUMMARY OF THE INVENTION

An insulated BNC connector assembly includes a metallic panel-mount portion and a user-replaceable non-metallic shell. The non-metallic shell is attached to the panel-mount metallic portion of the BNC connector such that, when mounted on an oscilloscope, or other electronic instrument, the non-metallic shell may be disconnected from the metallic portion of the BNC connector without having to gain access to the interior of the instrument housing. Thus, in the event of damage to the non-metallic shell, the damaged non-metallic shell may be replaced by a user, instead of having to return the instrument to the manufacturer for repair.

In a first embodiment of the invention, the metallic portion of the assembly has an externally-threaded portion, and the non-metallic shell potion of the assembly has a cut-away area to expose the threaded portion of the metallic portion of the assembly. The non-metallic shell slides over the metallic portion and is secured by a nut that engages with the threads on the metallic portion.

In a second embodiment of the invention, the metallic portion has external threads and the non-metallic shell is internally-threaded so that it can be screwed-on to mating threads formed on the metallic portion of the connector.

In a third embodiment of the invention, the non-metallic shell and metallic portion of the BNC connector may include features allowing a "snap fit" to retain the two portions in close association while still allowing removal of the non-metallic shell when necessary.

In a fourth embodiment, a non-metallic shell slides tightly over the metallic portion of the BNC connector and is prevented from rotating during the mating process by a pair of keyways formed in the shell and matching metallic keys formed on the metallic portion of the BNC connector.

DETAILED DESCRIPTION OF THE EMBODIMENTS

Figure 1:
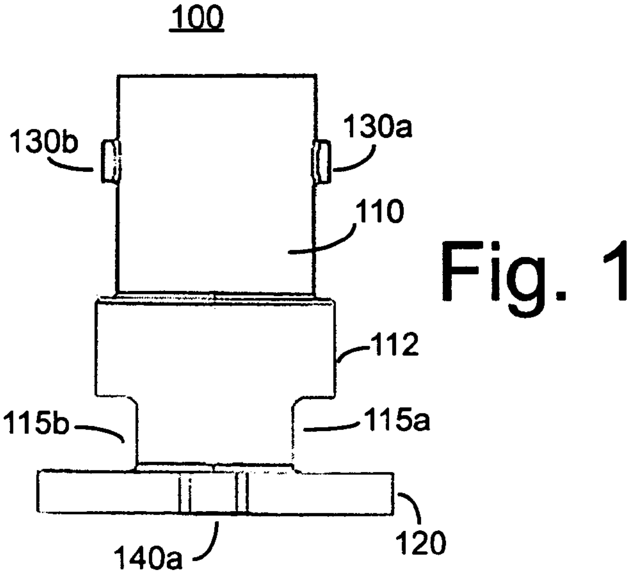
FIG. 1 shows a side view of an insulated BNC connector shell according to a first embodiment of the subject invention.
Figure 4:
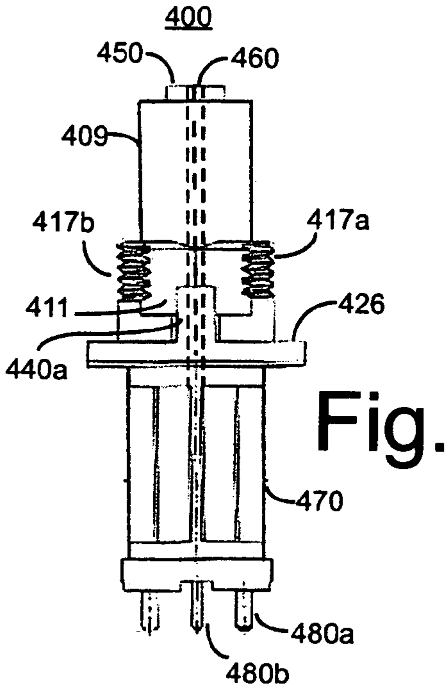
FIG. 4 shows a side view of a metallic portion of an insulated BNC connector shell according to a first embodiment of the subject invention.

The subject insulating BNC connector includes two parts, a non-conductive shell 100 of FIG. 1, and a panel-mount metallic body 400 of FIG. 4. Similar features in the different FIGURES have been assigned similar reference numerals.

Figure 6:
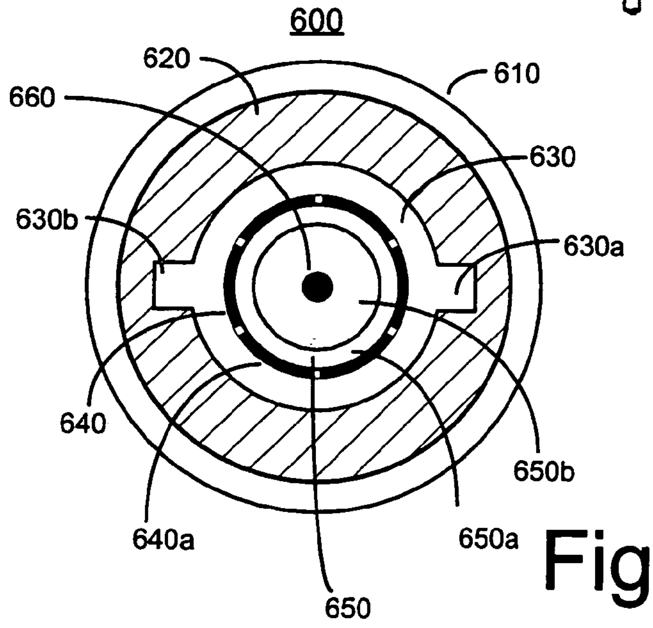
FIG. 6 shows a view looking into a cable-mounted insulated BNC connector suitable for mating with the insulated BNC connector assembly of the subject invention.

Referring to FIG. 1, non-conductive shell 100 includes a cylindrical portion 110 and a base 120. Non-conductive shell 100 is preferably molded in plastic. Cylindrical portion 110 has a pair of cutouts 115*a* 115*b* spaced 180 degrees apart, which allow access to a threaded portion of metallic body 400 when shell 100 is installed on metallic body 400. Cylindrical portion 110 also includes a pair of projections 130 positioned 180 degrees apart and extending radially outward. These projections are known in the art as "bayonets", and are used to secure a mating cable-mounted BNC connector (600 of FIG. 6) in a twist-lock arrangement. Base 120 includes a pair of cutouts 140 spaced 180 degrees apart, and used to prevent rotation of shell 100 when mating it with connector 600.

Figure 2:
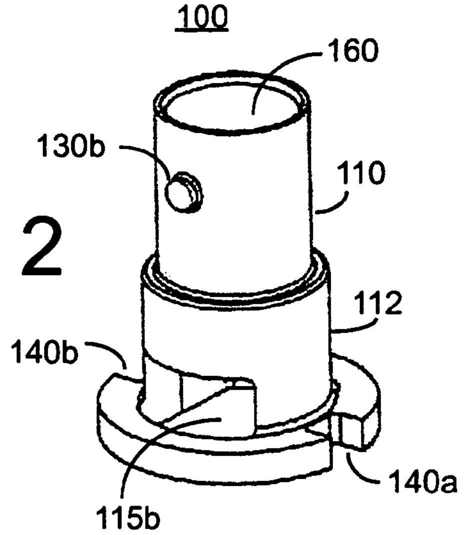
FIG. 2 shows a perspective view of the insulated BNC connector shell of FIG. 1.

FIG. 2 shows non-conducting shell 100 in perspective view for ease of understanding. Non-conductive shell 100 has an upper portion 110 and a lower portion 112.

Figure 3:
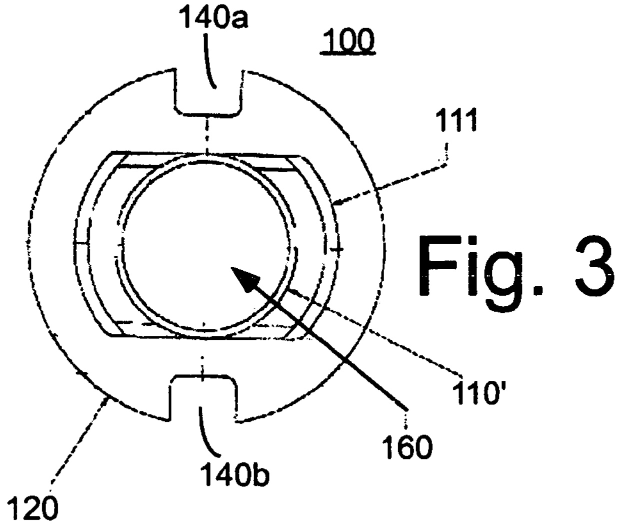
FIG. 3 shows a bottom view of the insulated BNC connector shell of FIG. 1.

FIG. 3 is a bottom view of non-conducting shell 100, wherein 110' is the inside circumference of cylindrical portion 110, and defines a hollow core 160. As mentioned above, base 120 has two cutouts 140*a* 140*b* spaced 180 degrees apart. Base 120 also has a substantially oblong aperture extending upward through the lower portion 112 of shell 100.

FIG. 4 shows a second portion of the insulating connector of the subject invention, a panel mount metallic body 400. Panel mount metallic body 400 includes a metallic cylindrical portion 409, a substantially oblong portion 411, and a pair of externally-threaded areas 417*a* 417*b* on oblong portion 411, and a pair of projections 440*a* 440*b* spaced 180 degrees apart. Substantially oblong portion 411 has a major axis and a minor axis, and threaded areas 417*a* 417*b* are formed at the ends of the major axis of oblong portion 411.

Projections 440*a* 440*b* are used to prevent rotation of shell 100 when mating it with connector 600. Projections 440*a* 440*b* are of a suitable length as to allow them to extend through a front panel 700 of FIG. 7 and engage cutouts 140*a* 140*b* of shell 100 to prevent the above-mentioned rotation of non-conductive shell 100. Panel mount metallic body 400 also includes a non-conductive cylinder 450 surrounding a metallic cylindrical receptacle 460 used for receiving a conductive center pin 660 of mating connector 600 of FIG. 6. Panel mount metallic body 400 also includes a substantially circular section 426 that seats against the back of front panel 700 when installed thereon. Panel mount metallic body 400 also includes a lower portion 470 that carries the conductors 480*a* 480*b* that connect metallic cylindrical portion 410 and center conductor receptacle 460 to a circuit board (not shown).

Figure 5:
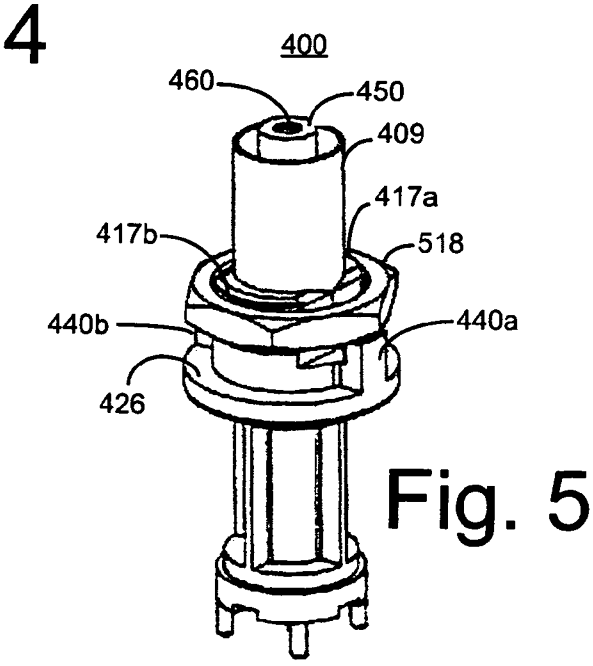
FIG. 5 shows a perspective view of metallic portion the insulated BNC connector assembly of FIG. 1.

FIG. 5 shows a panel mount metallic body 400 in perspective view for ease of understanding. Panel mount metallic body 400 is shown with a mounting nut 518 engaging threaded areas 517*a* 517*b*. Mounting nut 518 is used to secure non-conductive shell 100 to panel mount metallic body 400, and to secure the assembly to front panel 700.

As noted above, FIG. 6 shows a view looking into a cable-mounted insulated BNC connector 600 suitable for mating with the insulated BNC connector assembly of the subject invention. Connector 600 includes a non-conductive plastic covering 610 that prevents the user from coming in contact with a metallic body 620. Metallic body 620 is in physical and electrical contact with the braid (i.e shield) conductor of the BNC cable (not shown). While normally at ground potential, in floating measurement applications, the voltage on the shield may rise to a level of several hundred volts. A substantially cylindrical aperture 630 allows the above-described generally cylindrical portion 110 of shell 100 to enter the connector 600. A pair of substantially rectangular slots 630*a*, 630*b* extend aperture 630 to accommodate the passage of bayonets 130*a*, 130*b* of shell 100. Slots 630*a* and 630*b* extend along metallic body 620 for a given distance and then turn substantially 90 degrees to form a twist-lock engagement with bayonets 130*a*, 130*b* of shell 100. This twist-lock arrangement is well known in the art and need not be shown and described. Cylindrical portion 409 of panel mount metallic body 400 extends through panel 700 and engages substantially cylindrical aperture 630. BNC connector 600 also includes a slotted metallic cylinder 640 having a plurality of segments 640*a*. Segments 640*a* are spring loaded slightly into aperture 630. Segments 640 mate with the inside surface of metallic cylindrical portion 409 and are compressed slightly by that contact to ensure good electrical connection.

Figure 7:
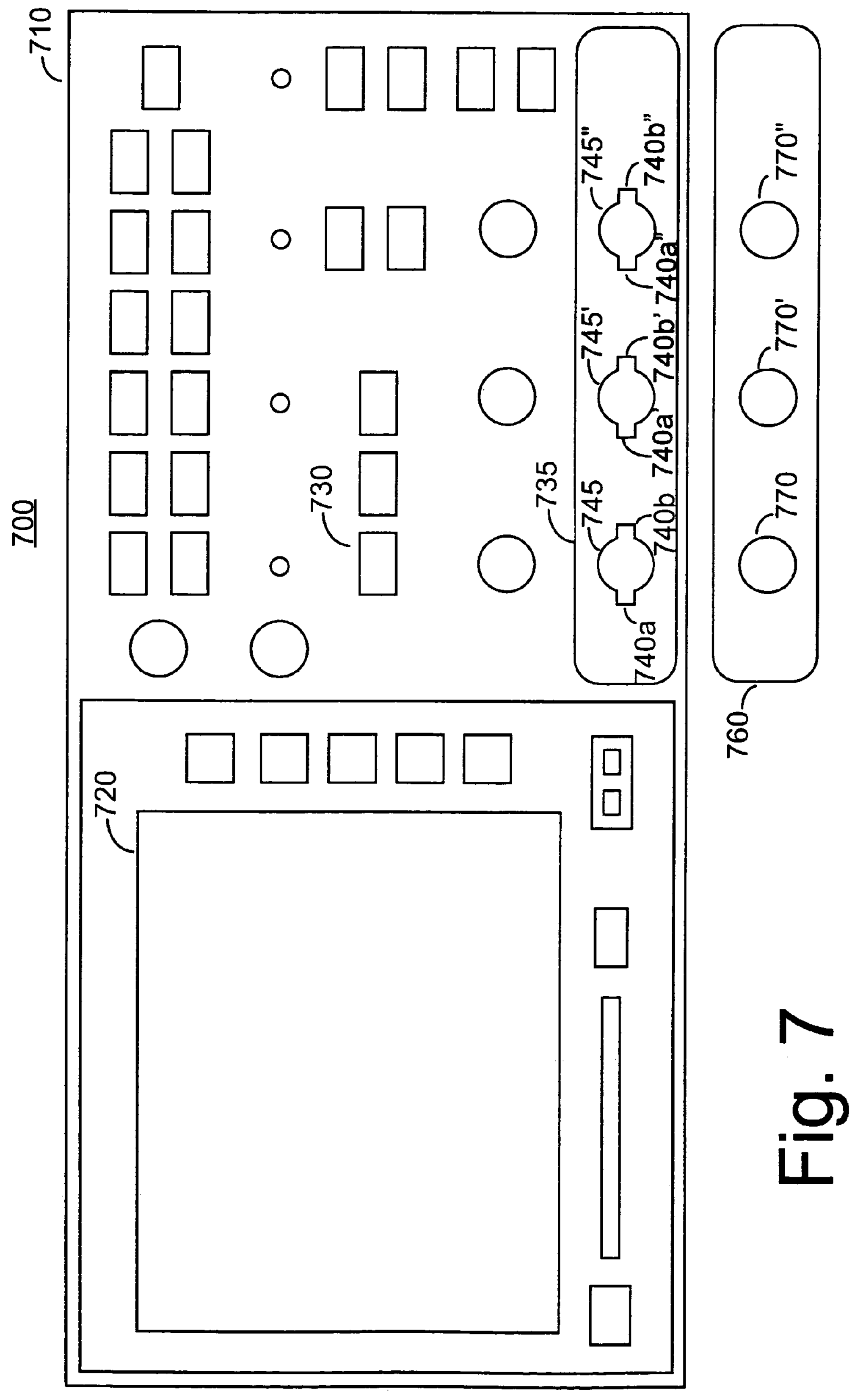
FIG. 7 shows a front panel of for an oscilloscope, said front panel being suitable for use with the insulated BNC connector assembly of the subject invention.
Figure 11:
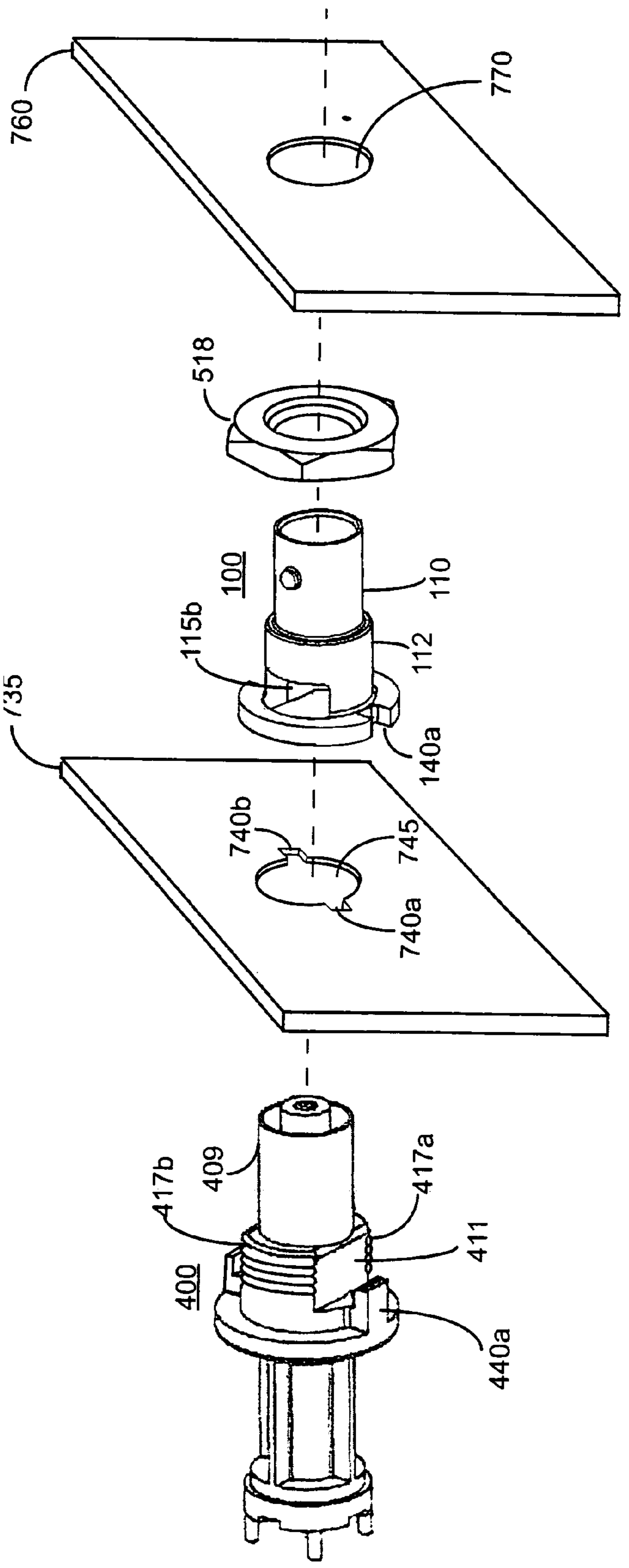
FIG. 11 shows an assembly view of the insulated BNC connector of FIGS. 1 through 5.

FIG. 7 shows a plastic front panel 700 of an instrument, such as an oscilloscope, before components are mounted on it. Front panel 700 has a variety of apertures 730 formed through it for the mounting of various knobs and pushbuttons. A recessed area 735 is formed in front panel 700, and three apertures 745, 745', and 745" are provided for the mounting of insulated BNC connectors of the subject invention. Referring also to FIG. 11, aperture 745 includes a pair of rectangular cutouts 740*a* 740*b* to allow the mounting of panel mount metallic body 400 to the rear of front panel 700 at recessed portion 735. Rectangular cutouts 740*a* 740*b* receive projections 440*a* 440*b* of panel mount metallic body 400 to prevent its rotation during mating with BNC connector 600.

After panel mount metallic body 400 is attached to front panel 700 from the rear, non-conductive shell 100 is slid in place over panel mount metallic body 400, and the assembly is locked together by applying mounting nut 518. A decorative panel 760 snaps into place over cylindrical portion 409 via apertures 770, 770' and 770", thus isolating mounting nut 518 and protecting a user from touching it during normal use of the instrument.

FIG. 11 shows an assembling view of the insulated BNC Connector of the subject invention. Metallic portion 400 is inserted through aperture 745 of front panel portion 735 of front panel 700. Projections 440*a*, 440*b* extend through cutouts 740*a*, 740*b* and thereafter prevent rotation of metallic portion 400. Non-conductive shell 100 is then slid in place over metallic portion 400, and pushed down so that projections 440*a*, 440*b* engage cutouts 140*a*, 140*b* of non-conductive shell 100, and threaded portions 417*a*, 417*b* are operable through openings 115*a*, 115*b* of non-conductive shell 100. Nut 518 slides over non-conductive shell 100 and its threads engage threaded portions 417*a*, 417*b* of metallic portion 400, thereby locking the assembly in place on front panel portion 735 of front panel 700. Decorative panel 760 snaps into place over cylindrical portion 110 via aperture 770, thus isolating mounting nut 518 and protecting a user from touching it during normal use of the instrument.

In operation, a user may discover that bayonets 130 have been sheared off in normal use. Rather than send the entire instrument to the factory for repair, the user may change the broken non-conductive shell 100, himself. He would first remove decorative panel 760, then remove mounting nut 518, slide the broken non-conductive shell off of metallic portion 400, then replace the non-conductive shell by following the recited steps in reverse order.

Figure 8:
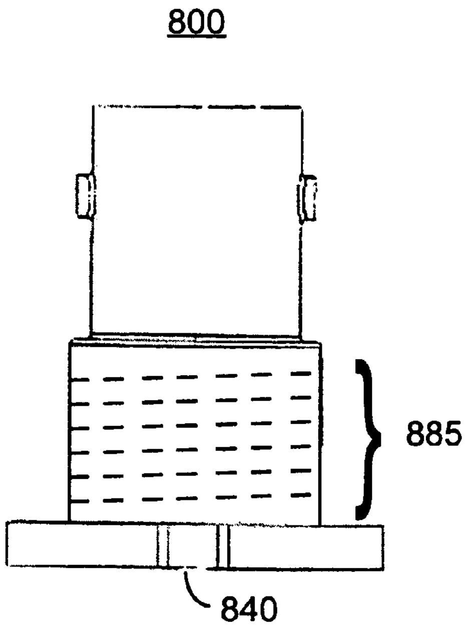
FIG. 8 shows an insulated BNC connector according to a second embodiment of the subject invention.

A second embodiment of a non-conductive shell 800 of the subject invention is shown in FIG. 8. All portions of non-conductive shell 800 are identical to shell 100 except that cutouts 115*a* and 115*b* are not provided, and an internally-threaded portion 885 is provided. Internally threaded portion 885 is intended to screw onto externally threaded portion 417*a* 417*b* of panel mount metallic body 400. In this embodiment, projections 422*a* 422*b* are shorter in length such that they engage apertures 750, but end flush with the front side of front panel 700, so as to not interfere with the screwing-on of shell 800. In this case, anti-rotation fingers (not shown) are molded onto the rear of panel 760 to engage cutouts 840 of non-conductive shell 800 to prevent rotation of shell 800.

Figure 9:
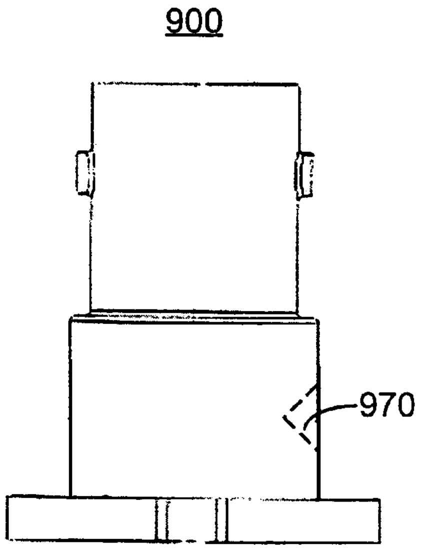
FIG. 9 shows an insulated BNC connector according to a third embodiment of the subject invention.

FIG. 9 shows a third embodiment of the invention in which a non-conductive shell 900 slips over a metallic panel mount portion and locks in place by means of a snap fit arrangement 970.

Figure 10:
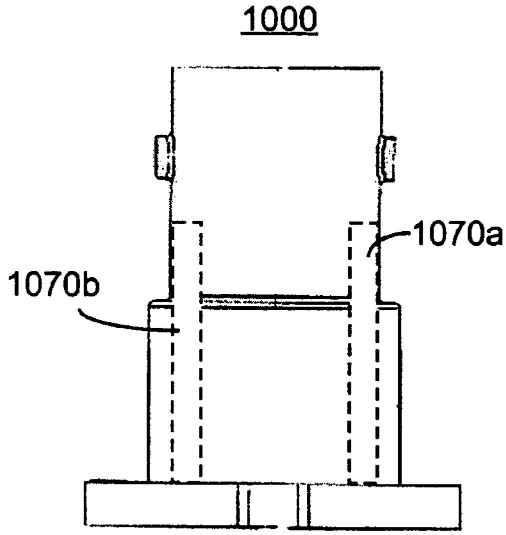
FIG. 10 shows an insulated BNC connector according to a fourth embodiment of the subject invention.

FIG. 10, shows a fourth embodiment of the invention in which a non-conductive shell 1000 snuggly slips over a metallic panel mount portion and is prevented from rotating by the presence of two metallic keyways 1070*a* 1070*b*.

What has been described is an insulated BNC connector that allows a field service representative, or a customer, to quickly and easily replace a failed non-metallic BNC shell. One skilled in the art will realize that there are many ways to detachably connect an insulating shell to the body of a BNC connector, while three such embodiments have been described herein in detail, the following claims are not intended to be so limited, but rather, are intended to encompass other mechanical mounting techniques.

While the invention has been described in the environment of test and measurement instruments, such as, an oscilloscope, or the like, it is equally usable on any electronic equipment having a need to isolate the shell of the BNC connector from earth ground.

What is claimed is:

1. An insulated BNC connector assembly, comprising:

a non-conductive shell; and a panel-mount metallic portion;

said non-conductive shell insulating said panel-mount metallic portion when mounted thereon;

when said BNC connector assembly is mounted on a panel of an electronic instrument, said non-conductive shell can be removed from said metallic portion of said BNC connector without having to gain access to the interior of said instrument.

2. The insulated BNC connector of claim 1, wherein said non-conductive shell is plastic.

3. The insulated BNC connector of claim 1, wherein said panel-mount metallic portion includes an oblong portion having a major axis and a minor axis and having a threaded area formed at the ends of said major axis.

4. The insulated BNC connector of claim 3, wherein said non-conductive shell has a pair of cutouts allowing access to said threaded areas of said metallic portion.

5. The insulated BNC connector of claim 4, further including a nut cooperating with said threaded areas to secure said non-conductive shell to said metallic portion.

6. The insulated BNC connector of claim 3, wherein said non-conductive shell has an internally-threaded portion allowing said non-conductive shell to be screwed onto said threaded areas of said metallic portion.

7. The insulated BNC connector of claim 6, wherein a decorative cover of said panel includes a projection cooperating with a cutout in said non-conductive shell to prevent rotation of said non-conductive shell with respect to said panel.

8. The insulated BNC connector of claim 3, wherein said panel-mount metallic portion has a projection for cooperating with a rectangular aperture in said panel to prevent rotation of said panel-mount metallic portion with respect to said panel.

9. The insulated BNC connector of claim 1, wherein said panel-mount metallic portion and said non-conductive shell have cooperating snap-fit features to secure said non-conductive shell to said panel-mount metallic portion.

10. The insulated BNC connector of claim 1, wherein said panel-mount metallic portion and said non-conductive shell have a snug sliding fit; and a cooperating key and keyway features to prevent rotation of said non-conductive shell with respect to said panel-mount metallic portion.

* * * * *